United States Patent [19]

Brown

[11] 4,384,254
[45] May 17, 1983

[54] OSCILLATOR/DRIVER CIRCUIT FOR FLUXGATE MAGNETOMETER

[75] Inventor: Robert E. Brown, Silver Spring, Md.

[73] Assignee: The United States of America as represented by the Secretary of the Navy, Washington, D.C.

[21] Appl. No.: 157,925

[22] Filed: Jun. 6, 1980

[51] Int. Cl.³ .................. G01R 33/04; H03K 3/30
[52] U.S. Cl. ......................... 324/253; 331/112; 307/282; 307/275
[58] Field of Search ................... 324/253–255; 331/65, 112, 117 A; 307/273, 275, 314, 267, 282

[56] References Cited

U.S. PATENT DOCUMENTS 2,957,145 10/1960 Bernalien ........................... 331/112
3,649,908 3/1972 Brown ............................... 324/253
3,681,711 8/1972 Hanby ............................... 307/275

Primary Examiner—Gerard R. Strecker
Assistant Examiner—Walter E. Snow
Attorney, Agent, or Firm—R. S. Sciascia; W. R. Henderson; J. G. Wynn

[57] ABSTRACT

A low power expenditure oscillator/driver circuit including a transistor and drive and control windings connected thereto and being operatively wound on a magnetic core suitable for use in a fluxgate magnetometer is disclosed. Its low power expenditure feature is provided, inter alia, by including an additional resistor in the base circuit of the transistor portion thereof so as to lengthen the base current pulses which permits their termination to be controlled by saturation of the magnetic core.

5 Claims, 7 Drawing Figures

OSCILLATOR/DRIVER CIRCUIT FOR FLUXGATE MAGNETOMETER

BACKGROUND OF THE INVENTION

The present invention relates to a fluxgate micropower magnetometer and more particularly to an oscillator driver portion thereof for decreasing the power required for core saturation therein to a range of 50 to 150 microwatts.

Fluxgate magnetometers in general require that electrical current be supplied periodically to a winding to magnetically saturate one or more magnetic cores. The presence of an applied magnetic field such as the earth's field or the field of a magnetic body such as a motorized vehicle is detected by an additional signal produced on sensor windings wound on the core as the magnetic material of the core cycles in and out of saturation and exhibits non-linear magnetic permeability.

A certain amount of energy E must be supplied in each cycle to magnetically saturate the magnetic material. Material volume and other material parameters as well as geometry and drive circuit efficiency control the magnitude of this energy. Expenditure of energy E in a fluxgate magnetometer permits one sample of the ambient magnetic field to be taken and a numerical value assigned to it through a calibration procedure. This numerical value varies from cycle to cycle because of fluctuations in the magnetic material parameters and in the circuitry supplying the saturating drive current. If n samples per second are taken and averaged, a more stable value for the field measurement is obtained in some desired bandwidth. For a specified bandwidth and field measurement stability (noise) some power nE must be continuously expended to operate the fluxgate magnetometer. For the value of nE to be a minimum it is important to select an appropriate magnetic core and to optimize drive circuit efficiency and stability. The magnetometer of the present invention optimizes drive circuit efficiency and stability and also provides for selection of n and E independently.

Prior art magnetometers include devices such as the two core gradiometer disclosed in Brown, U.S. Pat. No. 3,649,908, wherein a low-noise flyback oscillator/driver, similar to FIG. 1 of the present application supplies unidirectional current to the drive windings to drive the cores around a portion of the hystersis curve. The oscillator/driver circuit is controlled by feedback windings around both cores. A pair of sensor windings are wound on each core and each sensor winding carries a signal composed of the induced drive signal and a magnetic field induced signal that varies with the ambient field. Although the oscillator/driver circuit of Brown has many advantages, the repetition rate, n, of core saturation is controlled, for a given V, largely by the inductance of the drive windings and to some extent by stray capacitances in the circuit. Seeking to reduce magnetometer power consumption significantly through lowering n in the nE product leads to an unacceptably large number of turns on the drive winding if its inductance is increased sufficiently. Not only does an increased number of turns on the drive winding add to cost, the oscillator/driver efficiency and stability are reduced because of increased winding resistance, increased winding capacitance and decreased turns coupling to the core.

SUMMARY OF THE INVENTION

Accordingly, there is provided in the present invention a fluxgate micro-power magnetometer driven by an oscillator/driver with low power expenditure on the order of 50 to 150 microwatts. The driving and control windings of the oscillator/driver are wound on a magnetic core. The drive winding is connected to the collector of a transistor and the control winding is connected to the base. Detection of an ambient magnetic field is done with additional windings on the same core which are connected to two axis a balanced pulse-average difference detector. The low power feature of the oscillator/driver is provided for by including an additional resistance in the base circuit of the oscillator/driver to lengthen the base current pulses. Lowering of the ratio of reactance to resistance (Q) of the control winding inductance-capacitance circuit of the oscillator/driver lengthens the pulses until their termination is controlled by the effect of core saturation on the signal developed on the control winding. The magnetometer has a dynamic range which is very linear and large in comparison to the earth's magnetic field.

OBJECTS OF THE INVENTION

It is an object of the present invention to provide a magnetometer which can be driven with low power expenditure.

Another object is to provide a magnetometer with a repetition rate independently controllable from the core winding inductances.

Yet another object is to provide a magnetometer having uniform sensitivity over a wide range of applied fields.

A further object of the invention is to provide a fluxgate magnetometer with an ON interval terminated only by core saturation.

A still further object of the invention is to provide a fluxgate magnetometer with automatic adjustment of ON interval length as applied field is added to or subtracted from the saturating field.

Other objects, advantages, and novel features of the present invention will become apparent from the following detailed description of the invention when considered in conjunction with the drawings.

BRIEF DESCRIPTION OF THE DRAWINGS

A more complete appreciation of the invention and many of the attendant advantages thereof will be readily understood by reference to the following detailed description when considered with the accompanying drawings in which like reference numerals designate like parts throughout the figures and wherein.

DESCRIPTION OF THE PREFERRED EMBODIMENT

Figure 1:
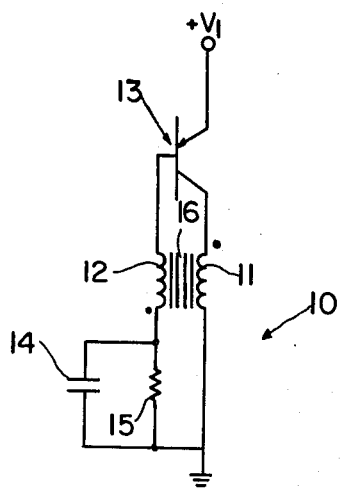
FIG. 1 is a schematic diagram of a magnetometer driven by a low-noise flyback oscillator.

Referring to FIG. 1 there is illustrated a low-noise flyback oscillator/driver 10 which is a stable and efficient current source for driving fluxgate magnetometers. For low-noise performance the oscillator/driver 10 is operated in the "flyback" mode in which the ON interval, for core saturation, is substantially longer than the OFF interval thus resulting in high power expenditure.

Drive winding 11 and control winding 12 are toroidally wound on a moly-permalloy tape-wound bobbin core 16 and connected to provide positive feedback to the base circuit of transistor 13. Drive winding 11 is coupled to the collector of transistor 13 and control winding 12 is coupled to the base of transistor 13. The transistor may be a PNP type such as a 2N2906, for example, or other equivalent transistor. The base circuit is provided with capacitor 14 and resistor 15 connected in parallel between the drive winding and the control winding. A power source V, is applied to the emitter of transistor 13 and through drive winding 11 to ground. The power required to operate oscillator/driver 10 is approximately 5 milliwatts.

The fluxgate magnetometer of FIG. 1 requires that electrical current be supplied periodically to the drive winding and control winding to magnetically saturate the magnetic core. A certain energy E must be supplied in each cycle to bring about saturation of the magnetic core. Material volume and other material parameters as well as core geometry and drive circuit efficiency control the magnitude of this energy.

Expenditure of energy E permits one sample of the ambient field to be taken and a numerical value assigned to it through a calibration procedure. This numerical value varies from cycle to cycle because of fluctuations in the magnetic material parameters and in the circuitry supplying the saturating drive current. If n samples per second are taken and averaged, a more stable value for the field measurement is obtained in some desired bandwidth. For a specified bandwidth and field measurement stability (noise) some power nE must be continuously expended to operate the fluxgate magnetometer. For the value of nE to be a minimum it is important to select an appropriate magnetic core and to optimize drive circuit efficiency and stability. It is also necessary to provide means to control selection of n and E independently.

The selection of a magnetic core having the desired material parameters and a geometry yielding a useful range of sensitivity-noise-power consumption combinations as other circuit components are varied plus the selection of an efficient pulse drive fixes E in the above analysis to a value of about one erg. Thus, power reduction can best be realized by decreasing n, the repetition rate of the oscillator.

For a given value of supply voltage V the pulse repetition rate of oscillator/driver 10 of FIG. 1, and thus n above, is largely determined by the inductance $L_1$ of drive winding 11. Increasing $L_1$ increases both the length of the ON interval and the OFF interval while their ratio retains a similar value. Unfortunately, the number of turns required for the drive winding becomes quite large and necessitates inconvenient adjustments elsewhere in the magnetometer circuitry. The increased winding resistance and stray capacitance begin to degrade oscillator/driver efficiency and stability without significant power reduction.

Figure 2:
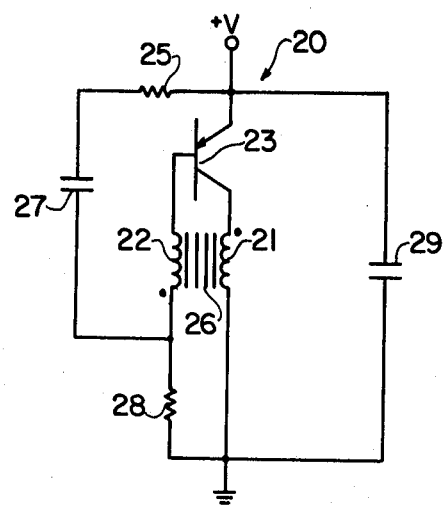
FIG. 2 is a schematic diagram of the micro-power oscillator circuit of the subject invention.

Features of a driving oscillator that are deemed necessary for fluxgate magnetometer operation at very low power expenditure are (1) a repetition rate controllable independent of core winding inductances and (2) a current-ON interval terminated only by core saturation. Referring to FIG. 2 there is illustrated a schematic diagram of the micro-power oscillator/driver circuit 20 of the subject invention. Drive winding 21 and control winding 22 are toroidally wound on a moly-permalloy tape-wound bobbin core 26 and connected to provide positive feedback to the base circuit of transistor 23. Drive winding 21 is coupled to the collector of transistor 23 and control winding 22 is coupled to the base of transistor 23. Transistor 23 may be a PNP type such as a 2N2906, for example, or other equivalent transistor. The base circuit is provided with a series resistor 25 and capacitor 27 which are coupled in parallel with control winding 22. A resistor 28 is coupled in series with both control winding 22 and the parallel circuit of resistance 25 and capacitor 27. A power source is applied to the emitter of transistor 23 and through drive winding 21 to ground.

When current starts to flow through drive winding 21 in the circuit of FIG. 2, a signal of proper polarity appears across control winding 22 to cause base current to flow charging capacitor 27 and driving the transistor 23 into the saturation region. As the voltage across capacitor 27 approaches the voltage developed across control-winding 22, base circuit current ceases and the transistor turns off. The base current will turn on again after capacitor 27 discharges through resistor 28. Thus the length of the OFF interval is controllable by the resistance/capacitance time constant while the ON interval length is determined by the duration of appreciable base current flow through capacitor 27. Core saturation may participate in pulse termination, but in general it is achieved solely through the base current blocking action of capacitor 27.

Calling $L_2$ the inductance of control winding 22, the $L_2$ capacitance circuit is generally configured to have a high reactance to resistance ratio (Q) in a blocking oscillator so as to produce fast rise-time pulses. Lowering the Q of the $L_2$ capacitance circuit lengthens the pulses until their termination can be controlled by the effect of core saturation on the signal developed on control winding 22. The lowering of Q is accomplished by resistor 25. If $I_s$ is the collector current required in drive winding 21 to saturate the core, then core saturation is possible as long as base current $I_b > I_s/\beta$.

Figure 3A:
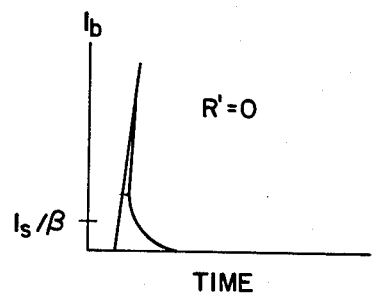
FIG. 3a and 3b are plots showing base current versus time for the circuit shown in FIG. 2.
Figure 3B:
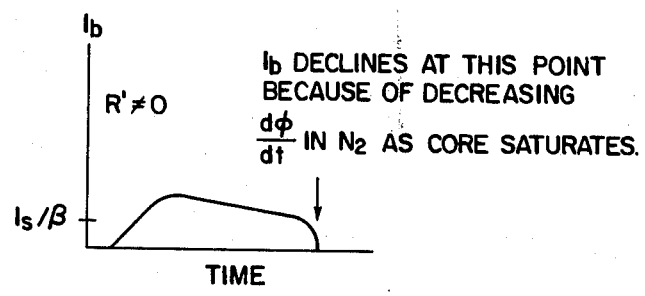

For resistor 25, FIGS. 3(a) and 3(b) show the time behavior for base circuit current ($I_b$) when the value of resistor 25 is R=0 and R≠0. This indicates how pulse length can be increased until the declining time rate of change of magnetic flux $d\phi/dt$ in the core at saturation terminates the pulse. For a particular minimum base current the achievable value of collector current ($I_s$) is dependent on the intrinsic flux density ($\beta$) of transistor 23. Thus it is desirable to select resistor 25 to have a resistance which matches transistor 23 so as to achieve the desired collector current ($I_s$).

Because resistor 25 has limited control in lengthening the base current pulse, it is necessary to keep the inductance of drive winding 21 low to limit the time required for core saturation. The values for the drive circuit illustrated in FIG. 2 are: drive winding 21=400 turns of #36 wire; control winding 22=100 turns of #36 wire;

resistor 28=1 megohm; resistor 25≅300 ohms (selected to set average current of 30 microamps); capacitor 27=0.01 mfd; capacitor 29=10 mfd; and V=4 volts. Both drive and control windings are evenly distributed around the bobbin core. Capacitor 29 keeps supply impedance low so that core saturation time is not lengthened. The duration of the driving pulse is about 4 microseconds with a repetition frequency of 800 Hz for the above circuit values. It is to be understood that the aforementioned values are provided to describe an operable circuit and are not meant to limit the inventive concept.

Figure 4:
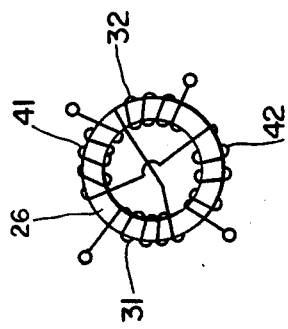
FIG. 4 is a schematic diagram of the sensor windings wound on the core.
Figure 5:
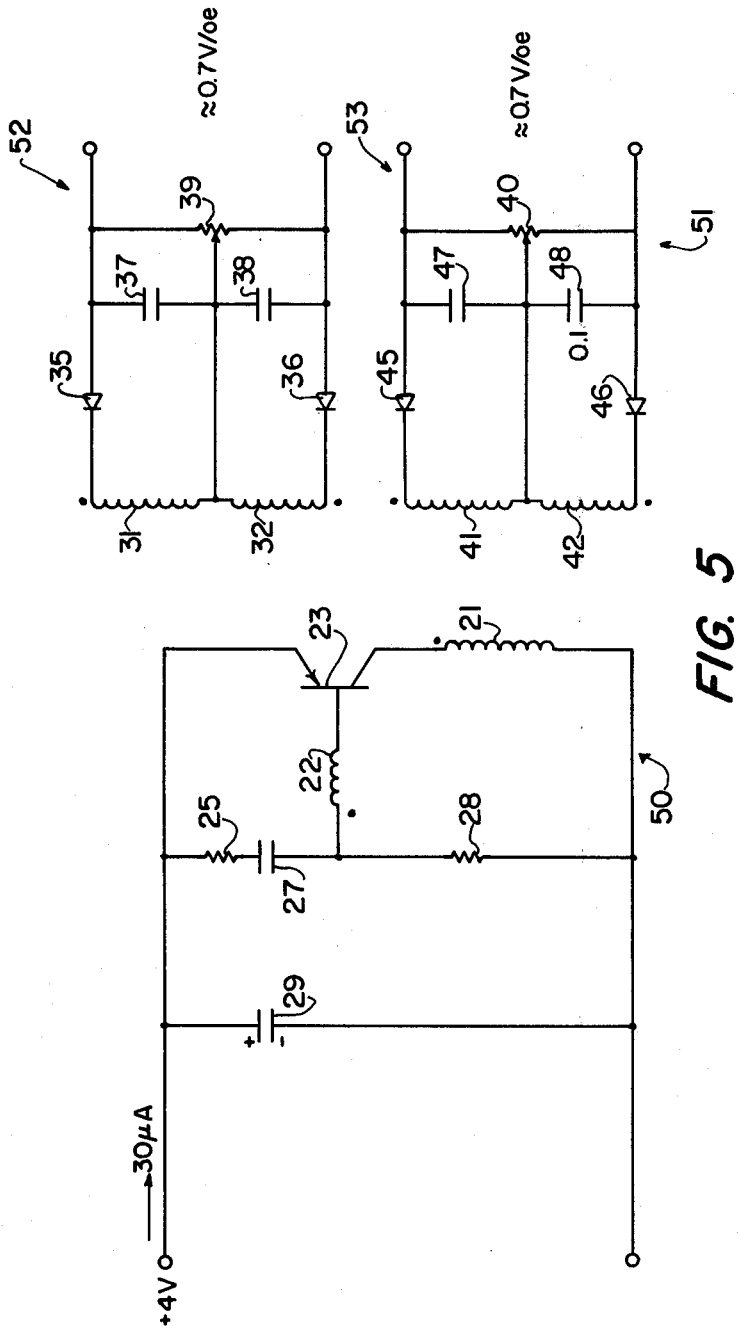
FIG. 5 is a schematic diagram of the micro-power oscillator circuit with two axis pulse-average difference detector.

As in prior magnetometers, detection of the ambient magnetic field dependent signal is done with additional windings on the core which are connected to a balanced pulse-average difference detector. FIGS. 4 and 5 illustrate how the difference between the averaged signals from windings on opposite sides of the ring core is measured. FIG. 4 illustrates sensor windings 31, 32, 41 and 42 wound on core 16 of a two axis magnetometer.

Referring to FIG. 5, there is shown a schematic circuit diagram of a two axis magnetometer with an oscillating circuit 50 and a two axis balanced pulse-average difference detector circuit 51 having a first axis detector 52 and a second axis detector 53. It is to be understood that if a single axis detector is desired, only one axis detector circuit is required. Oscillating drive circuit 50 has been described previously with respect to FIG. 2.

As shown in FIG. 5, sensor windings 31 and 32 input into a first balanced pulse-average difference detector 52 and sensor windings 41 and 42 input into a second balanced pulse-average difference detector 53.

The two axis detector illustrated in FIG. 5 is operated, in effect, by the energy stored in the magnetic core during the ON interval, producing high output with no additional power supply. The circuit is provided with diodes 35, 36, 45 and 46 which have polarity to conduct during the drive current OFF period. Diodes 35, 36, 45 and 46 may be type 1N914, for example, or other equivalent diodes. Capacitors 37, 38, 47 and 48 and resistors 39 and 40, shown in FIG. 5, are provided to filter out the drive frequency.

With the oscillator activated and as core magnetism collapses, equal signals are generated in sensor windings 31 and 32 of first axis detector 52. Windings 31 and 32 are connected so that equal signals cancel in the detection circuit in the absence of an external magnetic field. If an external magnetic field is present parallel to the axis of windings 31 and 32, extra signals appear on these windings as the core permeability changes from near unity at saturation to a high value at remanence. These signals are added in the detection circuit. The resistance-capacitance combination of capacitors 37, 38, 47 and 48 and resistors 39 and 40 provide running pulse-averages over time, depending on the bandwidth desired. For the circuit illustrated in FIG. 5, resistors 39 and 40 each have a value of 200K and capacitors 37, 38, 47 and 48 each have a value of 0.1 μfd for a 40 Hz bandwidth and output impedance of ~100K. In FIG. 5, resistors 39 and 40 are illustrated as potentiometers. It is to be understood that the aforementioned values are provided to describe an operable circuit and are not meant to limit the inventive concept.

Second axis detector 53 is provided with sensor windings 41 and 42 having axes perpendicular to the axes of windings 31 and 32. Windings 41 and 42 permit measurement of the perpendicular magnetic field with no additional expenditure of power.

Figure 6:
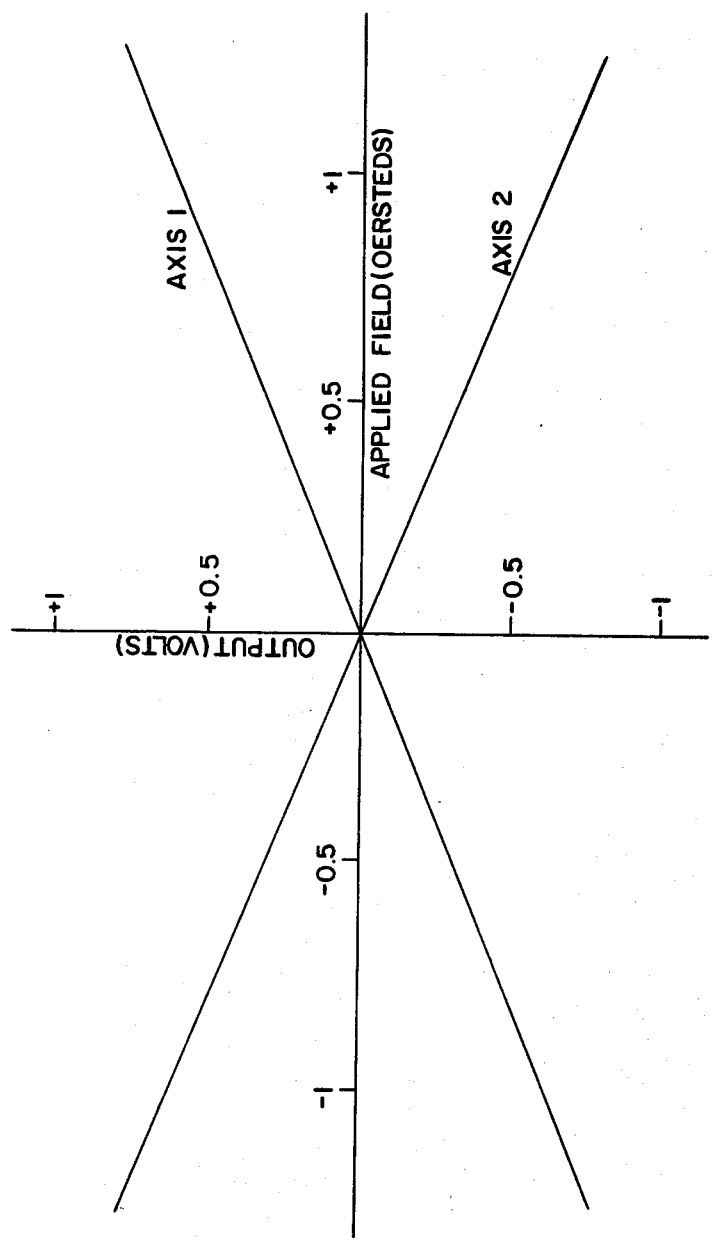
FIG. 6 is a plot of the dynamic range of the magnetometer of the subject invention.

Sensor windings 31, 32, 41 and 42 each have 200 turns of #36 wire distributed on 90° segments of the bobbin core 26. Each axis detector circuit 52 and 53 produces 0.7 volts per oersted of applied field with noise in a 1 Hz bandwidth varying from 5 to 30 gammas over the range of applied fields of ±1 oersted and at temperatures from −40° C. to +70° C. The spectral amplitude of the noise is constant for frequencies below 40 Hz. Current drain is 30 microamperes from a 4 volt supply for the two axis magnetometer 50. The power required to operate the two axis magnetometer is approximately 100 microwatts. The dynamic range of the two axis magnetometer 50, that is its sensitivity as a function of magnetic field intensity, is illustrated in FIG. 6. The dynamic range is very linear, which is unusual for magnetometers, and large ±1 oersted, in comparison to the earth's magnetic field, ~0.5 oersted.

It is apparent that the disclosed fluxgated magnetometer provides for low power expenditure on the order of 50 to 150 microwatts and uniform sensitivity over a wide range of applied fields. The magnetometer has a repetition rate independently controllable from the core winding inductances and an ON interval terminated only by core saturation. The ON interval length is automatically adjusted as applied field is added to or subtracted from the saturating field.

Many obvious modifications and embodiments of the specific invention other than those set forth above, will readily come to mind to one skilled in the art having the benefit of the teachings presented in the foregoing description and the accompanying drawings of the subject invention and hence it is to be understood that such modifications are included within the scope of the appended claims.

What is claimed is:

1. An improved oscillator/driver circuit for a magnetometer of the type having a transistor including emitter, base and collector terminals, and of the type having a drive winding and a control winding operatively wound on a magnetic core, one end of said drive winding being connected to the collector terminal of said transistor and the other end thereof being connected to ground, one end of said control winding being connected to the base terminal of said transistor and the other end thereof being connected to one end of a bias resistor forming thereat a junction, the other end of said bias resistor being connected to ground, and the emitter terminal of said transistor being connected to a power source so as to provide sufficient base current for turn on of said transistor and so as to provide positive feedback in the form of base current pulses from said drive winding to said control winding when said transistor is turned on, wherein the improvement comprises:

means operatively connected between the power source and the junction formed by the other end of said control winding and the one end of said bias resistor so as to control the on time of said transistor by increasing the length of the base current pulses provided by the positive feedback from said drive winding to said control winding such that termination of the base current pulses and the turning off of said transistor is substantially controlled by saturation of said magnetic core, and after turn off of said transistor, said means cooperating with said bias resistor to keep said transistor turned off for a predetermined time before said transistor is turned on again thereby reducing the power normally required to operate said improved oscillator/driver circuit.

2. The improved oscillator/driver circuit of claim 1 wherein said means operatively connected between the power source and the junction formed by the other end of said control winding and the one end of said bias resistor comprises, a timing capacitor having one end thereof connected to the junction and its other end connected to a series resistor, the other end of said series resistor being connected to the power source, said timing capacitor and said series resistor cooperating to cause lengthening of the base current pulses, and said timing capacitor and said bias resistor cooperating to keep said transistor turned off for the predetermined time.

3. The improved oscillator/driver circuit of claim 2 further comprising a capacitor having one end connected to the power source and the other end thereof connected to ground for lowering the impedance of the power source.

4. The improved oscillator/driver circuit of claim 3 further comprising a balanced pulse-average difference detector for generating an output level and being operatively coupled to said magnetic core such that the output level is generated in response to the energy stored in said magnetic core during the on time of said transistor, if an external magnetic field is present.

5. The improved oscillator/driver circuit of claim 4 wherein said balanced pulse-average difference detector further comprises:
a first axis detector having operatively coupled first and second sensor windings wound on said magnetic core such that equal signals therein cancel at the output of said first axis detector in the absence of an external field, and such that if an external field is present parallel to or at some angle to the axis of said first and second sensor windings, unequal signals therein generate an output level at the output of said first axis detector porportional to the external field strength; and
a second axis detector having operatively coupled second and third sensor windings wound on said magnetic core perpendicular to said first and second sensor windings such that equal signals therein cancel at the output of said second axis detector in the absence of an external field, and such that if an external field is present parallel to or at some angle to the axis of said second and third sensor windings, unequal signals therein generate an output level at the output of said second axis detector proportional to the external field strength.

* * * * *